United States Patent [19]

Coxon et al.

[11] Patent Number: 5,451,783
[45] Date of Patent: Sep. 19, 1995

[54] CHARGED-PARTICLE ANALYSER

[75] Inventors: Peter Coxon, Buxted; Bruce J. McIntosh, East Grinstead, both of England

[73] Assignee: Fisons plc, Ipswich, England

[21] Appl. No.: 218,115

[22] Filed: Mar. 25, 1994

[30] Foreign Application Priority Data

Mar. 26, 1993 [GB] United Kingdom ............. 9306374

[51] Int. Cl.⁶ ............................................. H01J 49/44
[52] U.S. Cl. ................................................... 250/305
[58] Field of Search ....................................... 250/305

[56] References Cited

U.S. PATENT DOCUMENTS

| | | | |
|---|---|---|---|
| 3,766,381 | 10/1973 | Watson | 250/305 |
| 4,255,656 | 3/1981 | Barrie et al. | 250/305 |
| 4,564,758 | 1/1986 | Slodzian et al. | 250/309 |
| 4,680,467 | 7/1987 | Bryson, III | 250/305 |
| 4,818,872 | 4/1989 | Parker et al. | 250/309 |
| 4,968,888 | 11/1990 | Appelhans | 250/306 |
| 5,286,974 | 2/1994 | Walker et al. | 250/305 |

FOREIGN PATENT DOCUMENTS

| | | |
|---|---|---|
| 0243060A | 4/1987 | European Pat. Off. . |
| 0417354A1 | 3/1991 | European Pat. Off. . |
| 0537961A1 | 10/1992 | European Pat. Off. . |
| 3113354 | 5/1991 | Japan . |

OTHER PUBLICATIONS

Prutton M. Surface Physics, Pub: Oxford University Press (abstract).
Woodruff, Delchar. Modern Techniques of Surface Science, Pub: Cambridge University Press (abstract).
Wei, J. Vac, Sci. Technol. 1988 vol. A6(4) pp. 2576–2581.
Hunt, Stoddart, Seah, Surface and Interface Analysis, 1981, vol. 3(4) pp. 157–160.
Werner, Warmoltz, J. Vac. Sci. Technol. 1984 vol. A2 (2) pp. 726–731.

*Primary Examiner*—Jack I. Berman
*Attorney, Agent, or Firm*—Chilton, Alix & Van Kirk

[57] ABSTRACT

A charged particle analyzer which irradiates a specimen and analyzes charged particles emitted therefrom, for example a photo electron spectrometer, having a flood-source which emits charged particles to neutralize the charge which develops on a specimen. The analyzer is provided with electrostatic and magnetic lenses which may be used separately or in combination. The flood source is provided within the lens column of the analyzer and is arranged such that when the electrostatic lens is in use, the charged particles emitted by the flood source pass around the outside of the objective electrostatic lens element, whereas when the magnetic lens is in use, or when both lenses are in use, they pass through that element.

12 Claims, 3 Drawing Sheets

CHARGED-PARTICLE ANALYSER

This invention relates to charged-particle analysers and in particular to energy spectrometers and microscopes. Primarily, the invention provides a means for investigating the surface properties of a specimen having a low electrical conductivity.

The use of charged-particle analysers for surface analysis is a well established practice and an introduction to this subject maybe found in many texts, such as for example, 'Surface physics' by M. Prutton (Oxford University Press) and 'Modern techniques of surface science' by D. P. Woodruff and T. A. Delchar (Cambridge University Press). The charged particles emitted from the specimen surface may take the form of positive ions, negative ions or most commonly electrons.

An energy spectrum of the sample may be obtained by means of a suitable energy analyser, typically of the electrostatic toroidal capacitor type. Alternatively, an image of the specimen may be formed by detecting the change in intensity of the emitted particles across the surface. Such techniques are commonly referred to as spectroscopy and microscopy respectively and provide complementary information relating to the specimen surface.

Photoelectron spectroscopy is often used to study the surface of a specimen. In this technique, the specimen is irradiated by means of an x-ray or ultraviolet source which causes electrons in the energy range from zero to several thousand electron Volts (eV) to be emitted from the surface. It is usual because of differences in the photon source to refer to x-ray photoelectron spectroscopy (XPS) and ultraviolet photoelectron spectroscopy (UPS). The emitted electrons may be focused by an electron lens and separated in energy by an analysing device. Electrons of a particular energy may then be selected by an aperture and detected by means such as channel multiplier and electronically recorded. The success of XPS in determining the electronic structure of surfaces has led to the requirement for a small area analysis capability from electron spectrometers. This [nay be achieved in two ways, firstly by restricting the area of the sample irradiated by the x-ray source and secondly by detecting electrons emitted from only a part of the specimen surface.

The developments in selected area XPS have led to a number of devices capable of Use as both a photoelectron spectrometer and a photoelectron microscope. The device described in U.S. Pat. No. 4,255,656 provides a means for selecting an area of the specimen surface by placing an apertured plate at the image plane of the electron lens so that only electrons from a part of the specimen surface will be admitted to the energy analyser. The resolution of the selected area which may be obtain in this instance is limited by a number of factors which include aperture size and lens properties such as electron optical aberrations.

The specification of U.S. Pat. No. 3,766,381 also describes a device for studying a selected area of a specimen which uses electrostatic lens elements. The use of suitable imaging fields makes possible the imaging of charged particles lying within a certain energy range. The resultant charged particle image is passed into an energy analyser to produce an energy resolved image which may be measured and electronically processed as required. Since charged particles may be emitted over a range of different energies, the imaging fields and energy analyser may be adjusted to create a spectrum of such energies. From the charged-particle image and spectrum it is possible to gain information regarding the physical and chemical nature of the surface region of the specimen.

European patent no. 0243060 describes in a preferred embodiment a device having both magnetic and electrostatic lens elements. A well known feature of a magnetic lens is that it has an imaging capacity greater than that of an electrostatic lens due to its lower spherical aberrations. Downstream electrostatic lens elements are provided for further manipulation of the charged particle beam before entering the energy analyser.

The use of a magnetic lens presents a particular problem for one classification of specimens. This arises in the study of insulating materials for which the local charging of specimens is known to result from the use of analysis techniques which liberate charged particles from the surface. It is common in the study of insulators to flood the sample with low energy particles having the same sign of charge as those emitted in order to neutralize the build up of charge on the surface, see for example U.S. Pat. No. 4,680,467. For an instrument having a magnetic objective lens, however, the use of a prior art charged particle flood source presents a particular problem which is described below and illustrated in FIG. 1.

FIG. 1 shows a diagrammatic representation of a magnetic lens and the associated imaging field of the lens. The lens 10 comprises pole pieces 11, 12 and a coil 13 which may be energised to provide a magnetic field which is represented by field lines 14. The field lines 14 are, symmetric about an axis passing through the centre of pole piece 11. The specimen 15 is mounted on specimen holder 16 and located on the axis of the magnetic field so that charged particles from the sample are focused and pass into lens column 17. Lens column 17 will typically contain one or more electrostatic lens elements 18. The vector nature of the magnetic field is such that charged particles experience a force at right angles to field, this direction is represented by dashed lines 19. Charged particles with trajectories on or near the field axis are focused into the lens column 17, while those with trajectories which lie off-axis will be directed toward the outside of lens column 17 or pole piece 12. While such an arrangement is ideal for providing a specimen image it also prevents low energy off-axis beams such as that from a conventional flood source from reaching the sample.

We have found a solution to this problem in the use of a flood source located close to the axis of the magnetic field. It has been found that if the flood source is sufficiently close to the axis, the magnetic focusing field does not impede the flow of particles from a flood source and in certain circumstances can actually assist their flow towards the specimen. It has been found that the source can be located sufficiently close to the axis if it is placed in lens column 17 and directed through electrostatic objective lens 18.

Thus, the invention provides a charged particle analyser for investigating a specimen comprising a magnetic lens for focusing charged particles emitted by a specimen into the analyser and a flood source for emitting charged particles of the same polarity as those emitted by the specimen, wherein the flood source is located within the lens column of the analyser and is arranged to direct charged particles through the end of the lens column to the sample.

Certain designs of charged particle analyser which use magnetic objective lenses are also provided with electrostatic objectives. In a preferred embodiment, such an analyser is provided and the flood source is arranged to direct charged particles through an electrostatic lens element.

In such apparatus, when using the electrostatic objective lens, that lens is electrically biased and, depending on the power of the lens, the passage of low-energy charged-particles from the flood source may be significantly restricted or prevented altogether.

In a preferred embodiment, the present invention overcomes these problems in a manner requiring only a single flood source and which requires no adjustment when changing between magnetic d electrostatic lenses.

It is an object of another aspect of the invention to provide a charged-particle analyser which is suitable for the study of insulating specimens and which uses a charged-particle lens which may operate using a magnetic lens, an electrostatic lens or a combination of magnetic and electrostatic lenses.

Thus, viewed from another aspect, the invention provides a charged-particle analyzer for investigating a specimen comprising:

(a) a specimen holder;
(b) a source of radiation placed so as to cause the emission of charged particles from a specimen placed on the specimen holder;
(c) a magnetic lens arranged such that at least some of the charged particles emitted from the specimen may be focused by means of a magnetic field and directed along an axis;
(d) analyzing means for analyzing the energy of the charged particles emitted from the specimen after they have been focused by said magnetic lens; characterized by the further provision of:
one or more sources of charged particles of the same polarity as those emitted by the specimen, the source(s) being arranged such that at least some of the charged particles emitted by them pass towards a specimen on said specimen holder substantially along said axis.

Preferably the spectrometer further comprises an electrostatic lens, comprising one or more electrodes having an aperture aligned with said axis through which charged particles emitted from a specimen may pass, and arranged so that at least some of the charged particles emitted from said specimen may be focused by means of an electrostatic field and wherein said source(s) of charged particles are further arranged such that when said magnetic lens is in use, at least some of the charged particles emitted by said source(s) are directed through the aperture(s) in said electrode(s) substantially along said axis towards said specimen, and when said magnetic lens is not in use, at least some of the charged particles emitted by said source(s) are directed towards a specimen on a path which does not pass through the aperture(s) in said electrode(s).

In a preferred embodiment, the spectrometer includes an apertured diaphragm to define an area of the specimen from which charged particles enter the analysing means.

In a further preferred embodiment, a second apertured diaphragm is included to define the collection angle of charged particles entering the analysing means.

In another preferred embodiment, one or more electrodes may be,used to direct charged particles from the said source onto the specimen.

In a still further preferred embodiment, the charged-particle source may additionally be used as a source of ionizing radiation for sample imaging.

The invention also extends to a method of investigating a specimen comprising the steps of (a) irradiating a specimen placed on a specimen holder so as to cause the emission of charged particles therefrom;

(b) providing a magnetic lens capable of focusing and directing along an axis at least some of the charged particles emitted from the specimen by means of a magnetic field;
(c) analyzing the energy of the charged particles emitted from the specimen after they have been focused by said magnetic field;
said method being characterized by the additional step of providing one or more sources of charged particles of the same polarity as those emitted by a specimen and directing at least some of the charged particles emitted by said source(s) towards a specimen substantially along said axis.

Preferably, the method further comprises the steps of (a) providing an electrostatic lens capable of focusing at least some of the charged particles emitted from the specimen by means of an electrostatic field, said electrostatic lens comprising one or more electrodes having an aperture aligned with said axis through which charged particles emitted from a specimen may pass, and
(b) when the charged particles emitted from a specimen are being focused by said magnetic field, directing at least some of the charged particles emitted by said source(s) through the aperture(s) in said electrode(s) substantially along said axis towards said sample; and when the charged particles emitted by the specimen are not being focused by said magnetic field, directing at least some of the charged particles emitted by said source(s) along a path towards said specimen which does not pass through the aperture(s) in said electrode(s).

A number of embodiments of the invention will now be described by way of example only and with reference to the accompanying drawings, in which.

The charged particles of the invention may be electrons, negative ions or positive ions. In order to simplify the descriptions that follow, reference has been made only to electrons but should not be construed as being limited to such.

Figure 1:
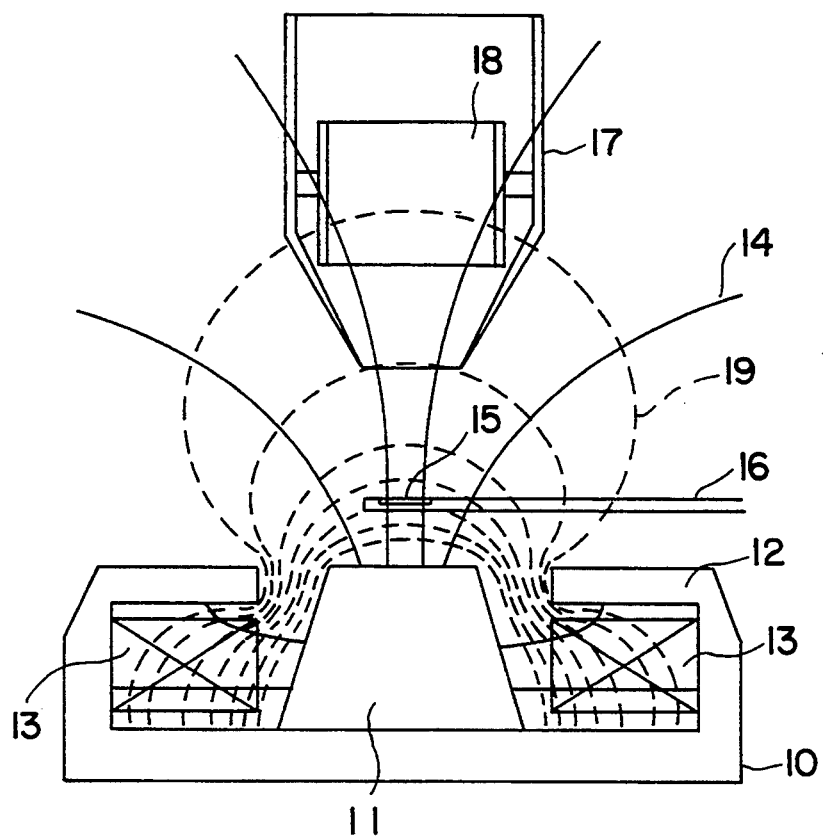
FIG. 1 is a schematic section of a magnetic lens of the type commonly used in a charged-particle analyser.
Figure 2:
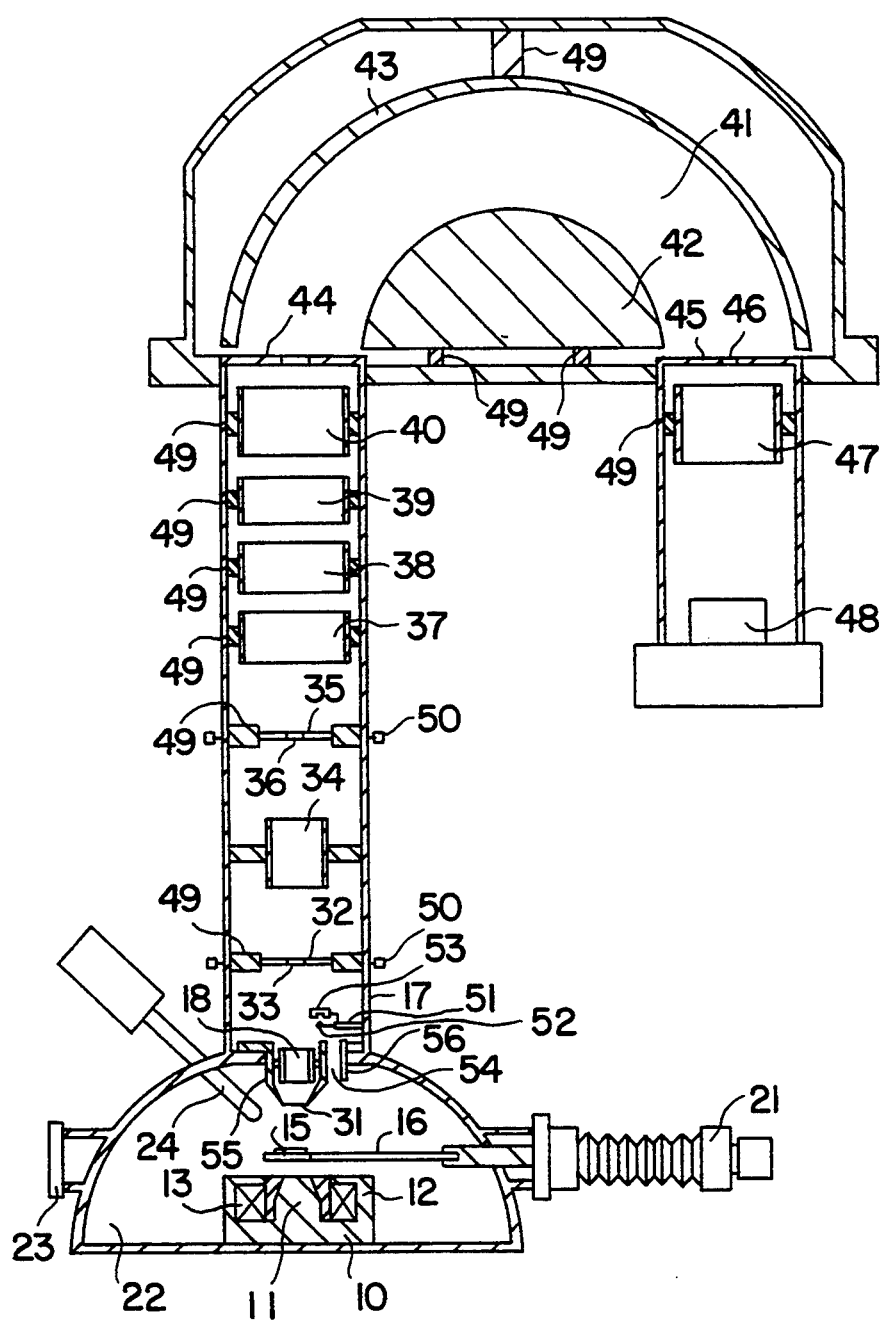
FIG. 2 shows a section of a preferred embodiment of the invention.

An embodiment of the invention is depicted in FIG. 2. The specimen 15 is shown supported by a specimen holder 16 which may be moved to the required position by manipulator 21 which ideally allows motion in three dimensions.

The specimen 15 is sealed within a vacuum chamber 22 which is preferably maintained at ultra high vacuum via a manifold 23 through which a suitable pump (not shown) may act. In order to ensure the surface cleanliness of the specimen it is desirable to achieve a pressure of less than $10^{-8}$ mb and preferably less than $10^{-10}$ mb.

The specimen 15 is irradiated by means of a radiation source 24 which is located adjacent the specimen. A suitable source of radiation are the intense K$\alpha$ characteristic x-ray emissions of light elements such as aluminium or magnesium. Electrons are emitted from the entire specimen surface having trajectories distributed over a large solid angle. The emitted electrons are focused by the magnetic field of an electron lens 10. The electron lens comprises a central pole piece 11 and a connected annular pole piece 12, between the two poles is an electrically energised coil 13 giving rise to a magnetic field along an axis at a right angles to the specimen surface. Electrons in the field of lens 10 pass into the lens column 17 through entrance 31. Focusing of the electrons may also be achieved by an electrostatic objective lens 18. In this preferred embodiment there are three possible modes of operation of the objective electron lens. Firstly, the magnetic lens 10 alone, secondly the electrostatic lens 18 alone and thirdly a combination of the electrostatic lens 18 with the magnetic lens 10 to form a compound objective lens. While the use of lens 18 is not necessary for the device to function, the provision of such allows greater flexibility and optimum use to be made of the device when the magnetic lens is not operational, for example, by allowing the device to function with a reduced imaging capability if the magnetic imaging field adversely affects the specimen or other analytical techniques used in the instrument. Such techniques might commonly include Auger electron spectroscopy, scanning electron microscopy, scanning Auger microscopy and electron energy loss spectroscopy.

The objective electron lens forms an image of the surface at diaphragm 32 located at the image plane of the lens. Aperture 33 allows passage of electrons from only a certain area of the specimen determined by the size of the aperture 33 and the magnification of the objective lens. Having passed through aperture 33, the electrons are further focused by electron lens 34. A further diaphragm 35 containing aperture 36 is located at the crossover plane of lens 34 in order to restrict the angular distribution of the transmitted electrons.

The diaphragms 32, 35 may advantageously have independently variable apertures 33, 36 to determine the properties of the electron image supplied to the energy analyser 41. Such variation is provided by actuating means 50 which act to open and close the apertures 33, 36. The preferred form of diaphragms 32, 35 is that of a mechanical iris similar to those used as aperture stops in optical instruments.

Following the diaphragm 35 is an electrostatic lens array composed of lens elements 37, 38, 39, 40. This lens array acts as necessary according to the electron energy to direct, decelerate and focus the electron beam into the hemispherical energy analyser 41 which comprises electrodes 42 and 43. A Herzog plate 44 is located at the analyser entrance to correct for fringing electric fields produced by the gap between electrodes 42 and 43. An electric field exists between the electrodes 42 and 43 which separates the electron beam into a spectrum of energies. At the focal plane of the energy analyser 41, may be located a detection means 45 such as a channel electron multiplier plate or array. By using suitable electronic means, (not shown) an energy spectrum of the sample may be obtained. An aperture 46 allows passage of a selected energy range, from E to E+E, of electrons. The electrons which pass through aperture 46 may be focused by electron lens 47 onto detector 48 where an image of the specimen is formed by electrons of the selected energy. The image obtained by detector 48 may be viewed directly using, for example, a phosphor screen or recorded electronically.

The lens elements 30, 34, 37–40, 47 and energy analyser electrodes 42, 43 are mounted on insulating supports 49 to allow for electrically biasing of these components. Similarly, any components which may be advantageously biased such as the apertured diaphragms 32, 35 should also be mounted on such insulating supports. Bias voltages are supplied to components by electrical feedthroughs from a voltage source means (not shown) located outside the vacuum housing 22.

An electron source 51 is mounted on lens column 17 and comprises a cathode 52 and a repeller electrode 53. The cathode 52 emits electrons which are directed toward specimen 15 by repeller electrode 53 which is energised to a suitable potential relative to the cathode 52. The electron source 51 is placed so that the emitted electrons may pass through both lens element 18 and a gap 54 between lens mounting 55 and the lens column 17. A focus electrode 56 is provided to direct the emitted electrons passing through gap 54 toward the sample 15. The electron source 51 is able to provide a flood of electrons to the sample when either the magnetic or the electrostatic objective lenses 10, 18 respectively are in use. The method of function of electron source 51 is detailed below in the description of FIG. 3.

The electron source 51 may also be used as an alternative radiation source to the x-ray source 24. The electrons provided by this source would typically have an energy in the range of several hundred electron volts (eV). The electron source 51 causes he release o secondary electrons and elastically scattered primary electrons from the specimen surface which may be imaged by setting the energy analyser 41 to the energy of the incident electron beam. In this way an electron image of the specimen is formed in the manner of that obtained from an electron microscope. This electron image of the sample may be used to align the specimen relative to the objective lens prior to use of the x-ray source 24.

Figure 3:
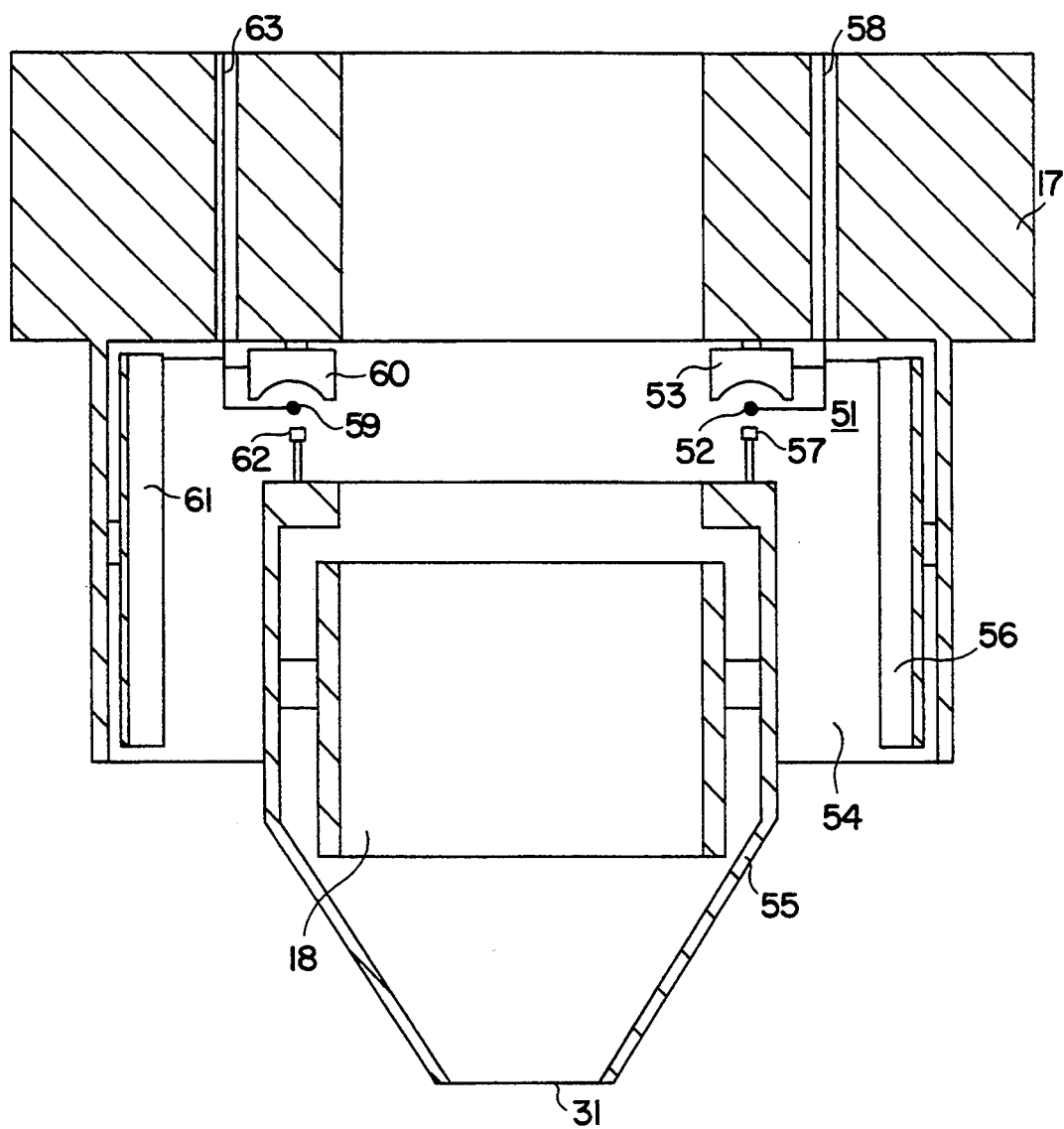
FIG. 3 is a schematic section of a preferred embodiment of the charged-particle source of the invention.

The mode of operation of the electron source of the invention is best illustrated by a further preferred embodiment of the electron source which illustrated in FIG. 3. FIG. 3 shows only the region of the analyser comprising the electron source 51 and electrostatic objective lens 18. The electron source 51 comprises a cathode 52 to produce electrons by thermionic emission and a trench shaped repeller electrode 53 to direct the electron emission. A further two electrodes are provided to enhance the performance of the electron source 51. Firstly, an emission splitter electrode 57 to divide the electron emission into two approximately equal beams and secondly, a focus electrode 56 to direct the electron emission passing into gap 54 toward the specimen (not shown). The repeller, focus and splitter electrodes 53, 56, 57 are all negatively biased with respect to cathode 52. The necessary electrical voltages are supplied to the electron source 51 by means of feedthrough 58

The invention will commonly function in one of two modes, utilizing either a magnetic objective lens or an electrostatic objective lens. As has been previously noted, changing between these two modes presents problems with the placing of an electron source. The function of the invention in these two modes will now be discussed. When the instrument is used with the magnetic objective lens, the electrostatic objective lens element 18 is at ground potential. Electrons from source 51 pass into the centre of lens element 18 and are then confined to travel in spiral trajectories by the magnetic field of the magnetic objective lens 10 (shown in FIG.

1) until they strike the specimen 15 at the point of analysis. Electrons which pass into gap 54 are focused toward the specimen by focusing electrode 56 but are then deflected away by the magnetic field of the magnetic objective lens 10. When the instrument is used with the electrostatic objective lens, electrons that pass into the lens element 18 become trapped by the field of the lens and ultimately collide with the surface of lens element 18. Electrons which pass around lens element 18 and into gap 54 are focused by focusing electrode 56 and may pass unhindered to the specimen. It is also possible to use both magnetic and electrostatic lens elements in combination to form a compound lens. In these circumstances electrons from the flood source may reach the specimen through the electrostatic lens as they would when only the magnetic lens is used. Although they will be attracted to the electrostatic element, provided that the magnetic field is dominant, it will tend to counteract the attractive force of the electrostatic element and direct the particles onto the specimen. The invention thus provides a single electron source able to provide an electron flux irrespective of the objective lens used and in a manner which is transparent to switching between lens modes.

If a greater flux of electrons is required or if a wider coverage is need, further electrons sources of this type may be provided. A second such electron source 58 is shown in FIG. 3 and comprises a cathode 59 and deflection, focusing and splitter electrodes 60, 61, 62 respectively. Voltages are supplied via feedthrough 63 and may be the same as or different to those of electron source 51.

We claim:

1. A charged-particle analyzer for investigating a specimen comprising:
    a specimen holder;
    a source of radiation placed so as to cause the emission of charged particles from a specimen placed on said specimen holder;
    a selectively energizable magnetic lens arranged such that at least some of the charged particles emitted from the specimen may be focused by means of the magnetic field provided thereby and directed along an axis;
    an electrostatic lens comprising at least a first electrode having an aperture aligned with said axis, charged particles emitted from the specimen passing through said aperture, said electrostatic lens being arranged so that at least some of the charged particles emitted from the specimen may be focused by means of the electrostatic field provided thereby;
    analyzing means for analyzing the energy of the charged particles emitted from the specimen after they have been focused by at least one of said lenses; and
    at least a first source of charged particles of the same polarity as those emitted from the specimen, said charged particle source being arranged such that at least some of the charged particles emitted thereby pass to the specimen substantially along said axis, said source of charged particles further being arranged such that when said magnetic lens is energized at least some of the charged particles emitted thereby are directed through said electrostatic lens aperture and substantially along said axis toward the specimen, at least some of the charged particles emitted by said source being directed toward the specimen on a path which does not pass through said electrostatic lens aperture when said magnetic lens is not energized.

2. A charged-particle analyzer as claimed in claim 1 further comprising at lest a first focus electrode positioned to direct charged particles emitted by said source toward the specimen when the magnetic lens is not energized.

3. A charged-particle analyzer as claimed in claim 1 further including a lens column disposed between said specimen holder and said analyzing means, said charged-particle source and said electrostatic lens being disposed in said lens column so that when said magnetic lens is not energized at least some of the charged particles emitted by said charged particle source pass outside said electrostatic lens.

4. A charged-particle analyzer as claimed in claim 3, wherein said electrostatic lens is located within a lens holder and an annular opening is provided around the lens holder through which charged particles emitted by said source(s) may pass.

5. A charged-particle analyzer as claimed in claim 4, further comprising at least a first focus electrode positioned around said lens holder for directing particles emitted from said charged particle source towards the specimen.

6. A charged-particle analyzer as claimed in claim 1, wherein said charged-particle source comprises a thermionic particle emitter, a repeller electrode and an emission splitter electrode.

7. A charged-particle analyzer as claimed in claim 1 in which an apertured diaphragm is placed between the magnetic and electrostatic lenses and the analyzing means to define an area of the specimen from which the charged particles are imaged.

8. A charged particle analyzer for investigating a specimen comprising:
    a specimen holder;
    a source of radiation placed so as to cause the emission of charged particles from a specimen placed on said specimen holder;
    a magnetic lens arranged so that at least some of the charged particles emitted from the specimen may be focused by the magnetic field produced by said magnetic lens and directed along an axis;
    analyzing means for analyzing the energy of the charged particles from the specimen after the focusing thereof by said magnetic lens; and
    at least a first source of charged particles of the same polarity as those emitted from the specimen, said charged particle source comprising a thermionic particle emitter, a repeller electrode and an emission splitter electrode, said charged particle source being positioned such that at least some of the charged particles emitted from said emitter will be directed to a specimen on said specimen holder substantially along said axis.

9. A method of investigating a specimen comprising the steps of:
    placing the specimen on a specimen holder and thereafter irradiating the specimen so as to cause the emission of charged particles therefrom;
    selectively establishing a magnetic field capable of focusing and directing along an axis at least some of the charged particles emitted from the specimen;
    interposing an electrostatic lens along said axis to thereby provide an electrostatic field for focusing at least some of the charged particles emitted from the specimen, the charged particles passing through an aperture in the electrostatic lens which is aligned with said axis;

analyzing the energy of the charged particles emitted from the specimen subsequent to the focusing thereof by at least one of said fields;

generating charged particles of the same polarity as those emitted from the specimen;

directing the generated charged-particles substantially along said axis to the specimen when the magnetic field is present; and directing at least some of the generated charged-particles to the specimen along a path which does not include the aperture in the electrostatic lens when the magnetic field is not present.

10. A method as claimed in claim 9 wherein when the generated charged particles are not passing through the aperture in said electrostatic lens such particles are directed toward the specimen by at least a first focus electrode.

11. A method as claimed in 9 wherein said electrostatic lens is disposed within a lens holder and an annular opening is provided around said lens holder through which charged particles emitted by said source may pass.

12. A method as claimed in claim 9, wherein the area of a specimen from which charged particles which are analyzed originate is defined by an apertured diaphragm disposed between said magnetic and electrostatic fields and a point at which the particles are collected for analyzing.

* * * * *